United States Patent
So et al.

(10) Patent No.: US 6,753,235 B2
(45) Date of Patent: Jun. 22, 2004

(54) METHOD OF MANUFACTURING CMOS THIN FILM TRANSISTOR

(75) Inventors: Woo Young So, Suwon (KR); Kyung Jin Yoo, Suwon (KR); Sang Il Park, Seoul (KR)

(73) Assignee: Samsung SDI, Co., Ltd., Suwon (KR)

(*) Notice: Subject to any disclaimer, the term of this patent is extended or adjusted under 35 U.S.C. 154(b) by 84 days.

(21) Appl. No.: 10/086,629

(22) Filed: Mar. 4, 2002

(65) Prior Publication Data

US 2002/0123201 A1 Sep. 5, 2002

(30) Foreign Application Priority Data

Mar. 2, 2001 (KR) .......................................... 2001-10843

(51) Int. Cl.$^7$ ............................................. H01L 21/331
(52) U.S. Cl. ..................... 438/373; 438/278; 438/301
(58) Field of Search ................................ 438/278, 290, 438/301, 372, 373, 377

(56) References Cited

U.S. PATENT DOCUMENTS 6,338,989 B1 * 1/2002 Ahn et al.
6,432,734 B1 * 8/2002 Chen et al.

* cited by examiner

Primary Examiner—Phuc T. Dang
(74) Attorney, Agent, or Firm—Staas & Halsey LLP

(57) ABSTRACT

A method of manufacturing a CMOS TFT including forming first and second semiconductor layers on an insulating substrate using a first mask, respectively, the substrate having first and second regions, the first semiconductor layer formed on the first region, the second semiconductor layer formed on the second region; forming sequentially a first insulating layer, a first metal layer and a second insulating layer over the whole surface of the substrate; etching a portion of the first metal layer and a portion of the second insulating layer over the first region of the substrate using a second mask to form a first gate electrode and a first capping layer; forming first spacers on both side wall portion of the first gate electrode and the first capping layer; ion-implanting a first conductive-type high-density impurity into the first semiconductor layer using the first spacers and the first gate electrode as a mask to form first high-density source and drain regions; etching a portion of the first metal layer and a portion of the second insulating layer over the second region of the substrate using a third mask to form a second gate electrode and a second capping layer; and ion-implanting a second conductive-type high density impurity into the second semiconductor layer using the third mask to form second high-density source and drain regions.

25 Claims, 7 Drawing Sheets

METHOD OF MANUFACTURING CMOS THIN FILM TRANSISTOR

CROSS-REFERENCE TO RELATED APPLICATIONS

This application claims the benefit of Korean Patent Application No. 2001-10843, filed on Mar. 2, 2001, under 35 U.S.C. §119, the entirety of which is hereby incorporated by reference.

BACKGROUND OF THE INVENTION

1. Field of the Invention

The present invention relates to a thin film transistor (TFT), and more particularly, to a method of manufacturing a CMOS TFT.

2. Description of the Related Art

In manufacturing an active display device, it is one of the most important parameters to prevent a leakage current in an off-state of a poly-Si TFT which is used as a switching element. In order to prevent a leakage current, the TFT having a lightly doped drain (LDD) structure or an off-set structure is employed.

There are various methods of manufacturing a conventional TFT having the LDD structure or the off-set structure: a method of forming source and drain regions after undercutting a gate electrode material or gate metal so that a gate electrode may have a smaller width than a photoresist pattern; a method of forming source and drain regions after forming a spacer on a sidewall of a gate electrode; and a method of forming source and drain regions after electrically oxidizing a gate metal to form a gate insulating layer.

FIGS. 1A to 1E illustrate a process of manufacturing a CMOS TFT having an LDD structure according to a conventional art.

As shown in FIG. 1A, a polycrystalline silicon material layer is deposited on an insulating substrate 10. The insulating substrate 10 includes an n-type TFT region 10a on which an n-type TFT will be formed and a p-type TFT region 10b on which a p-type TFT will be formed. The polycrystalline silicon material layer is patterned using a first mask (not shown) to form polycrystalline silicon layers 11a and 11b on the n-type TFT region 10a and the p-type TFT region 10b, respectively. The polycrystalline silicon layers 11a and 11b serve as semiconductor layers (ie., active layer) of the n-type TFT and the p-type TFT, respectively.

A photoresist pattern 12 is formed to cover the polycrystalline silicon layer 11b on the n-type TFT region 10b. A channel doping to the polycrystalline silicon layer 11a is performed to control a threshold voltage using the photoresist pattern 12 as a second mask. Thereafter, the photoresist pattern 12 is removed.

As shown in FIG. 1B, a gate insulating layer 13 is formed over the whole surface of the substrate 10 and covers the polycrystalline silicon layers 11a and 11b. A first metal layer is deposited on the gate insulating layer 13 and patterned using a third mask to form gate electrodes 14a and 14b.

Thereafter, an n-type low-density impurity is ion-implanted into the semiconductor layers 11a of the n-type TFT region 10a to form LDD regions 15 on both sides of the gate electrode 14a. At this point, the n-type low-density impurity ion-implanted into the p-type TFT region 10b does not affect the p-type TFT because it is offset by a p-type impurity that will be ion-implanted in a subsequent process.

Subsequently, as shown in FIG. 1C, a photoresist pattern 16 is formed on the n-type TFT region 10a. Using the photoresist pattern 16 as a fourth mask, a p-type high-density impurity is ion-implanted into the semiconductor layers 11b of the p-type TFT region 10b to form source and drain regions 17 on both end portions of the polycrystalline silicon layer 11b. Thereafter, the photoresist pattern 16 is removed.

Next, as shown in FIG. 1D, a photoresist pattern 18 is formed to cover the p-type TFT region and the LDD region 15 of the n-type TFT. Using the photoresist pattern 18 as a fifth mask, an n-type high-density impurity is ion-implanted into the polycrystalline silicon layer 11a of the n-type TFT to form source and drain regions 19.

As shown in FIG. 1E, an interlayer insulating layer 20 is formed over the whole surface of the substrate 10. The interlayer insulating layer 20 is patterned using a sixth mask to form contact holes 21a and 21b to expose portions of the source and drain regions 19 and 17.

A second metal layer is deposited over the whole surface of the substrate 10 and patterned using a seventh mask to form source and drain electrodes 22a and 22b. The source and drain electrodes 22a are connected to the source and drain regions 19 through the contacts holes 22a, respectively. The source and drain electrodes 22b are connected to the source and drain regions 17 through the contact holes 22b, respectively. Therefore, the CMOS transistor according to the conventional art is completed.

Meanwhile, if a process is omitted that ion-implants an n-type impurity into the polycrystalline layer 11a of the n-type TFT region 10a, an off-set region is formed instead of the LDD regions 15, so that the CMOS TFT having an off-set structure can be manufactured.

The CMOS TFT having the LDD structure or the off-set structure has an advantage in that a leakage current is lowered, whereupon display characteristics can be improved.

However, in order to manufacture the conventional CMOS TFT having the LDD structure or the off-set structure, many masks (i.e., seven masks) are required. Therefore, a manufacturing process is very complicated, thereby causing low manufacturing yield and high production cost.

SUMMARY OF THE INVENTION

Accordingly, it is an object of the present invention provide a method of manufacturing a CMOS TFT having an LDD structure having a simplified manufacturing process.

It is another object of the present invention to provide a method of manufacturing a CMOS TFT having an LDD structure having high manufacturing yield and low production cost.

The foregoing and other objects of the present invention are achieved by providing a method of manufacturing a CMOS TFT, comprising: forming first and second semiconductor layers on an insulating substrate using a first mask, respectively, the substrate having first and second regions, the first semiconductor layer formed on the first region, the second semiconductor layer formed on the second region; forming sequentially a first insulating layer, a first metal layer and a second insulating layer over the whole surface of the substrate; etching a portion of the first metal layer and a portion of the second insulating layer over the first region of the substrate using a second mask to form a first gate electrode and a first capping layer; forming first spacers on both side wall portions of the first gate electrode and the first capping layer; ion-implanting a first conductive-type high-density impurity into the first semiconductor layer using the first spacers and the first gate electrode as a mask to form first high-density source and drain regions; etching a portion of the first metal layer and a portion of the second insulating layer over the second region of the substrate using a third mask to form a second gate electrode and a second capping layer; and ion-implanting a second conductive-type high density impurity into the second semiconductor layer using the third mask to form second high-density source and drain regions.

The foregoing and other objects of the present invention may also be achieved by providing a method of manufacturing a CMOS TFT, comprising: forming first and second semiconductor layers on an insulating substrate using a first mask, respectively, the substrate having first and second regions, the first semiconductor layer formed on the first region, the second semiconductor layer formed on the second region; forming sequentially a first insulating layer, a first metal layer and a second insulating layer over the whole surface of the substrate; etching a portion of the first metal layer and a portion of the second insulating layer over the first region of the substrate using a second mask to form a first gate electrode and a first capping layer; ion-implanting a first conductive-type high density impurity into the first semiconductor layers to form first high-density source and drain regions using a third mask; etching a portion of the first metal layer and a portion of the second insulating layer over the second region of the substrate using a fourth mask to form a second gate electrode and a second capping layer; and ion-implanting a second conductive-type high density impurity into the second semiconductor layer using the fourth mask to form second high-density source and drain regions.

BRIEF DESCRIPTION OF THE DRAWINGS

These and other objects and advantages of the present invention will become apparent and more readily appreciated from the following description of the embodiments, taken in conjunction with the accompanying drawings of which.

DETAILED DESCRIPTION OF THE PREFERRED EMBODIMENTS

Figure 1A:
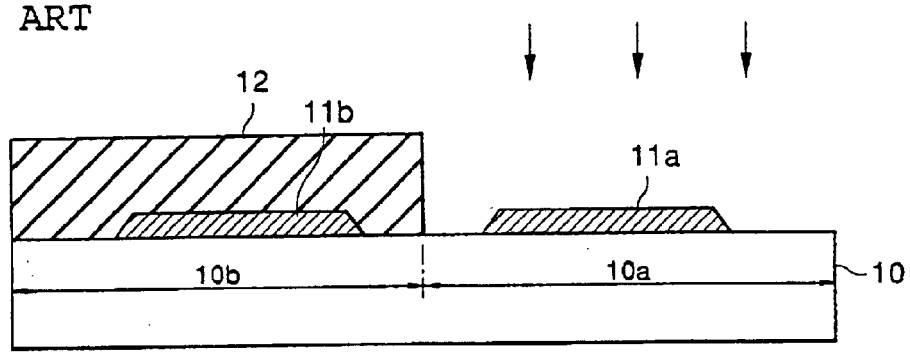
FIGS. 1A to 1E are cross-sectional views illustrating a process of manufacturing a CMOS TFT having a LDD structure according to a conventional art.
Figure 1B:
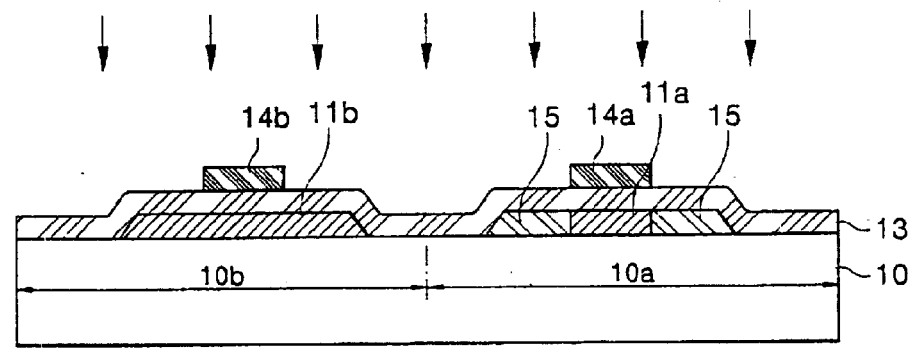
Figure 1C:
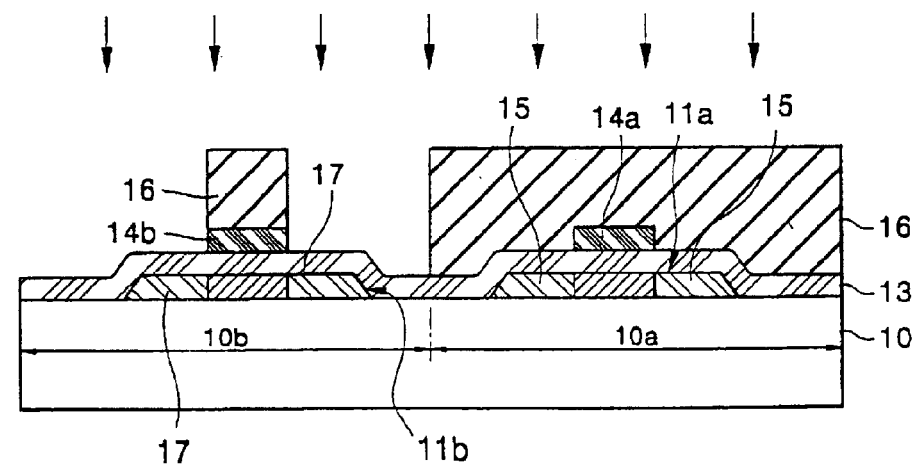
Figure 1D:
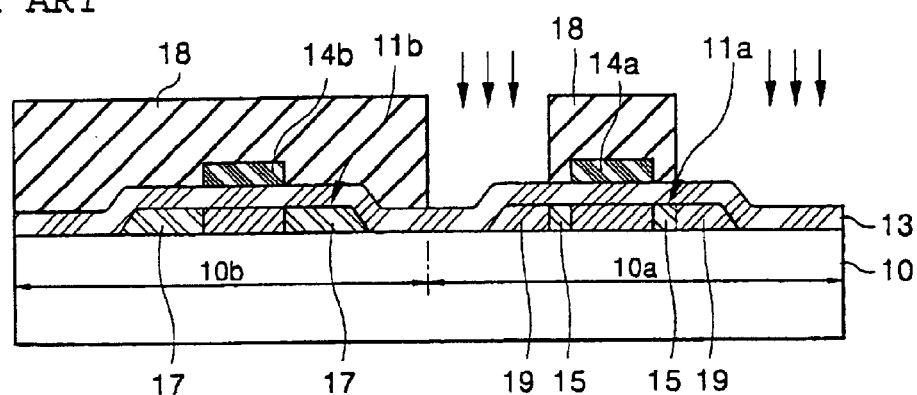
Figure 1E:
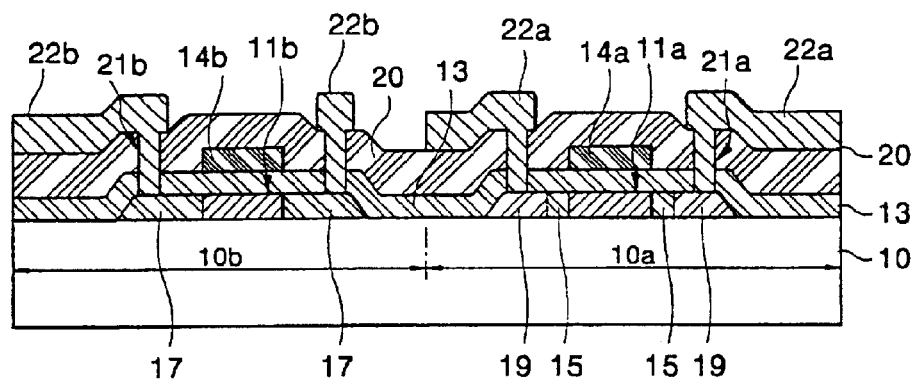

Reference will now be made in detail to the embodiments of the present invention, examples of which are illustrated in the accompanying drawings, wherein like reference numerals refer to the like elements throughout. The embodiments are described below in order to explain the present invention by referring to the figures.

FIGS. 2A to 2E are cross-sectional views illustrating a process of manufacturing a CMOS TFT having an off-set structure according to an embodiment of the present invention.

Figure 2A:
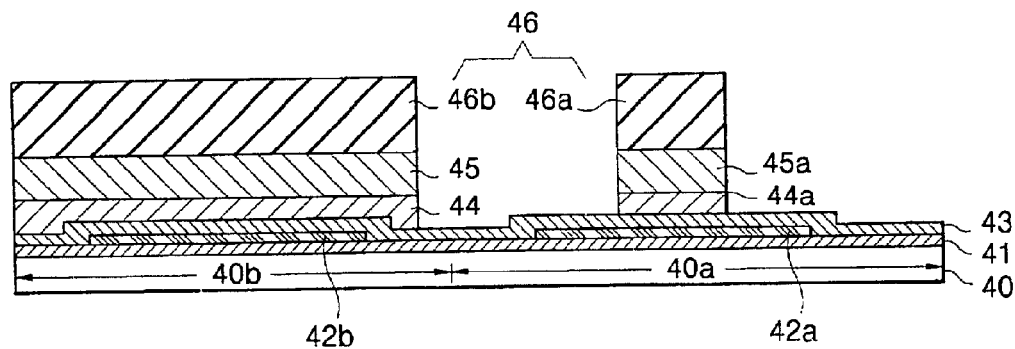
FIGS. 2A to 2E are cross-sectional views illustrating a process of manufacturing a CMOS TFT having an off-set structure according to an embodiment of the present invention.

As shown in FIG. 2A, a buffer layer 41 is formed on an insulating substrate 40. The insulating substrate 40 has an n-type TFT region 40a on which an n-type TFT will be formed and a p-type TFT region 40b on which a p-type TFT will be formed. A polycrystalline silicon layer is formed on the buffer layer 41 and then patterned using a first mask (not shown) to form semiconductor layers 42a and 42b on the n-type TFT region 40a and the p-type TFT region 40b, respectively.

A channel doping process for the semiconductor layer 42a on the n-type TFT region 40a can be performed after the semiconductor layers 42a and 42b are formed.

A first insulating layer 43, a first metal layer 44 and a second insulating layer 45 are sequentially formed. An oxidation layer or a nitride layer is used as the second insulating layer 45.

Subsequently a second mask 46 is formed on the second insulating layer 45. The second mask 46 includes patterns 46a and 46b. The pattern 46a is formed over the n-type TFT region 40a and is used as a mask for a gate electrode. The pattern 46b is formed over the p-type TFT region 40b and is used as a mask to protect the p-type TFT region when the gate electrode of the n-type TFT is formed.

Thereafter, using the second mask 46, the first metal layer 44 and the second insulating layer 45 are patterned to form a gate electrode 44a and a capping layer 45a of the n-type TFT before the second mask 46 is removed. This pattern may be formed by, for example, etching away the layers around the region where the mask 46 is formed.

Figure 2B:
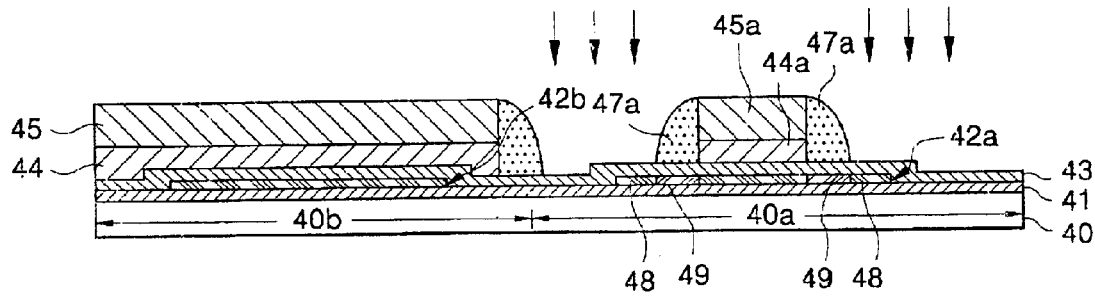

Then, as shown in FIG. 2B, a third insulating layer is formed over the whole surface of the substrate 40. As the third insulating layer, an oxidation layer or a nitride layer is used.

The third insulating layer is anisotropically etched to form spacers 47a on both side wall portions of the gate electrode 44a and the capping layer 45a.

Subsequently, using the gate electrode 44a and the spacers 47a as a mask, an n-type high-density impurity is ion-implanted into the semiconductor layer 42a to form source and drain regions 48 and to define an offset region 49.

In FIG. 2B, an ion implanting process is carried out using the gate electrode 44a and the spacers 47a to form the source and drain regions and the offset region. However, in order to form source and drain regions having an LDD structure, a low density impurity can be ion-implanted into the semiconductor layer 42a on the n-type TFT region 40a using the gate electrode 44a as a mask after the gate electrode 44a is formed using the second mask 46 in FIG. 2A, and then the high-density impurity can be ion-implanted after forming the spacers of FIG. 2B.

Figure 2C:
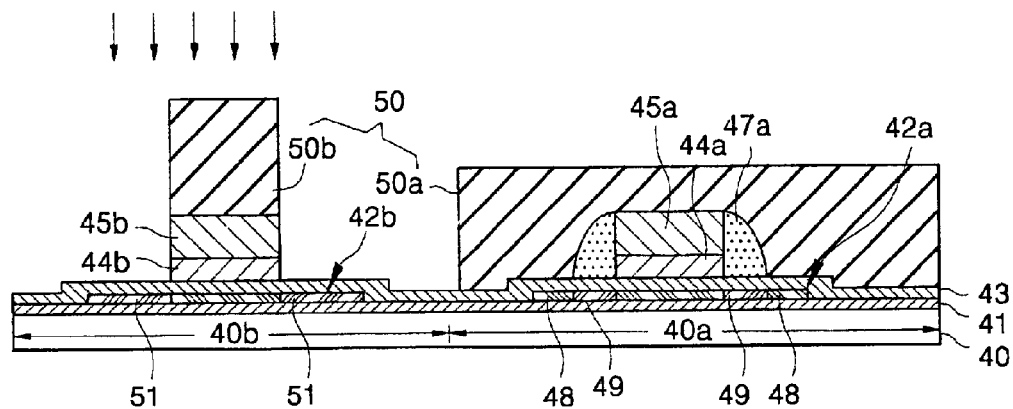

Subsequently, as shown in FIG. 2C, a photoresist layer is deposited over the whole surface of the substrate 40 and then patterned to form a photoresist pattern 50. The photoresist pattern 50 serves as a third mask. The third mask 50 includes patterns 50a and 50b. The pattern 50a is formed over the n-type TFT region 40a and is used as a mask to protect the n-type TFT region 40a when a gate electrode of the p-type TFT is formed and impurity is ion-implanted to form source and drain regions. The pattern 50b is formed over the p-type TFT region 50b and is used as a mask to form a gate electrode of the p-type TFT.

Next, using the third mask 50, a portion of the first metal layer 44 and a portion of the second insulating layer over the p-type TFT region 40b are patterned to a gate electrode 44b and a capping layer 45b of the p-type TFT.

Thereafter, a p-type high-density impurity is ion-implanted into the semiconductor layer 42b to form source and drain regions 51.

Figure 2D:
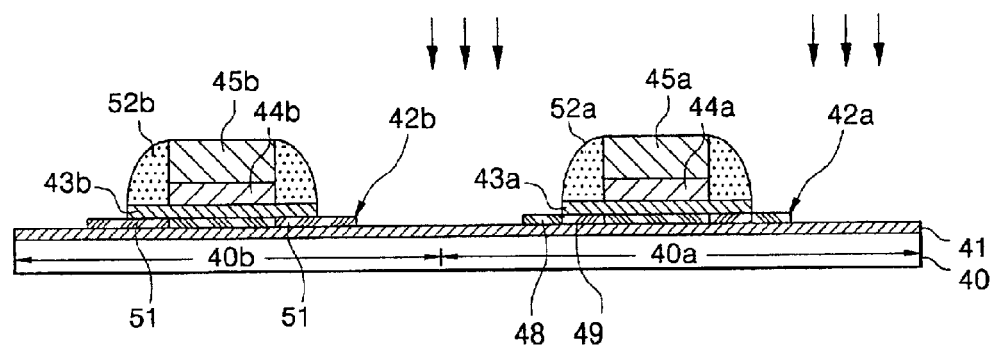

As shown in FIG. 2D, after removing the third mask 50, a fourth insulating layer is deposited over the whole surface of the substrate 40 and then anisotropically etched to form spacers 52a and 52b on both side wall portions of the gate electrode 44a and 44b and the capping layer 45b. An oxidation layer or a nitride layer is used as the fourth insulating layer.

At the same time, the first insulating layer 43 is patterned to form gate insulating layers 43a and 43b. The gate insulating layers 43a and 43b are formed under the gate electrodes 44a and 44b and the spacers 52a and 52b. Therefore, the high-density source and drain regions 48 and 51 are exposed. Also, since the gate electrodes 44a and 44b are insulated by the capping layers 45a and 45b and the spacers 52a and 52b, it is not required to form an interlayer insulator having contact holes.

Figure 2E:
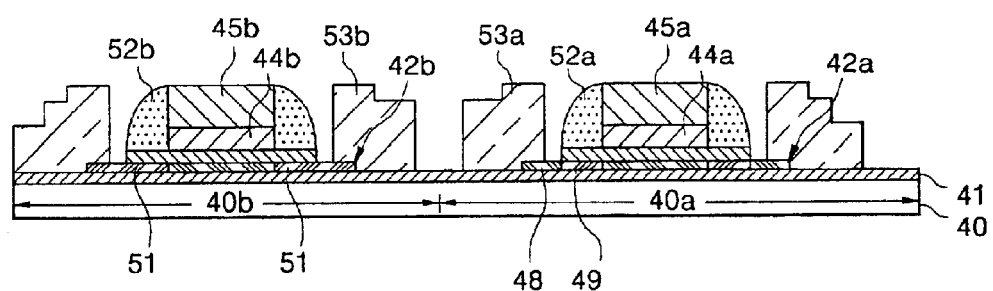

Subsequently, as shown in FIG. 2E, a second metal layer is deposited over the whole surface of the substrate 40 and then patterned using a fourth mask to form source and drain electrodes 53a of the n-type TFT and source and drain electrodes 53b of the p-type TFT. Therefore, the CMOS TFT having the off-set structure according to this embodiment of the present invention is completed.

The source and drain electrodes 53a and 53b directly contact the source and drain regions 48 and 51, respectively. However, since the gate electrodes 44a and 44b are insulated by the capping layers 45a and 45b and the spacers 52a and 52b, a short circuit between the gate electrode and the source and drain electrodes does not occur.

Even though not shown in the embodiments of the present invention, a gate line is formed at the same time when the gate electrodes are formed, and a data line is formed at the same time when the source and drain electrodes are formed.

FIGS. 3A to 3F are cross-sectional views illustrating a process of manufacturing a CMOS TFT having an LDD structure according to another embodiment of the present invention.

Figure 3A:
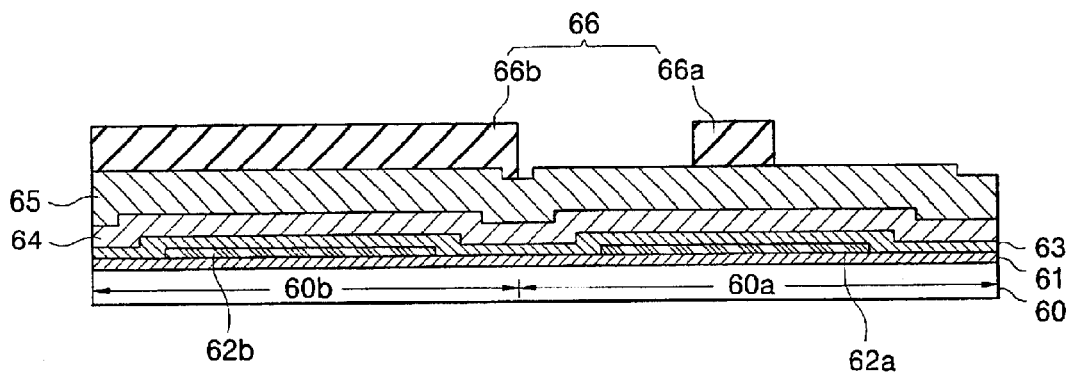
FIGS. 3A to 3F are cross-sectional views illustrating a process of manufacturing a CMOS TFT having an LDD structure according to another embodiment of the present invention.

As shown in FIG. 3A, an oxidation layer 61 is formed on an insulating substrate 60. The oxidation layer 61 serves as a buffer layer. The insulating substrate 60 includes an n-type TFT region 60a on which an n-type TFT will be formed and a p-type TFT region 60b on which a p-type TFT will be formed.

A polycrystalline silicon layer is deposited on the buffer layer 61 and then patterned using a first mask (not shown) to form a semiconductor layer 62a over the n-type TFT region 60a and a semiconductor layer 62b over the p-type TFT region 60b, respectively.

Even though not shown, a channel doping process for the semiconductor layers 62a and 62b can be performed to control a threshold voltage.

A first insulating layer 63, a first metal layer 64 and a second insulating layer 65 are sequentially deposited over the whole surface of the substrate 60. Then, a second mask 66 is formed on the second insulating layer. As the second insulating layer 65, an oxidation layer or a nitride layer is used.

At this point, a pattern 66a of the second mask 66 formed over the n-type TFT region 60a is used as a mask for a gate electrode of the n-type TFT, and a pattern 66b of the second mask 66 is used as a mask to protect the p-type TFT region 60b when a gate electrode of the n-type TFT is formed.

Figure 3B:
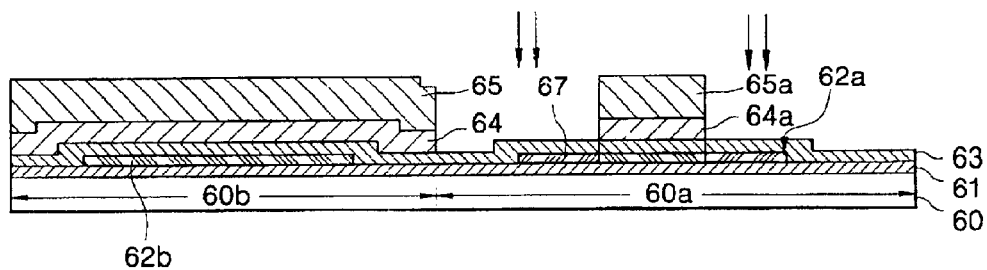

Subsequently, as shown in FIG. 3B, using the second mask 66, the first metal layer 64 and the second insulating layer 65 are patterned to form a gate electrode 64a and a capping layer 65a of the n-type TFT before the second mask 66 is removed.

Thereafter, an n-type low-density impurity is ion-implanted into the semiconductor layer 62a on the n-type TFT region 60a to form source and drain regions 67 on both end portions of the semiconductor layer 62a which are not covered with the gate electrode 64a.

Figure 3C:
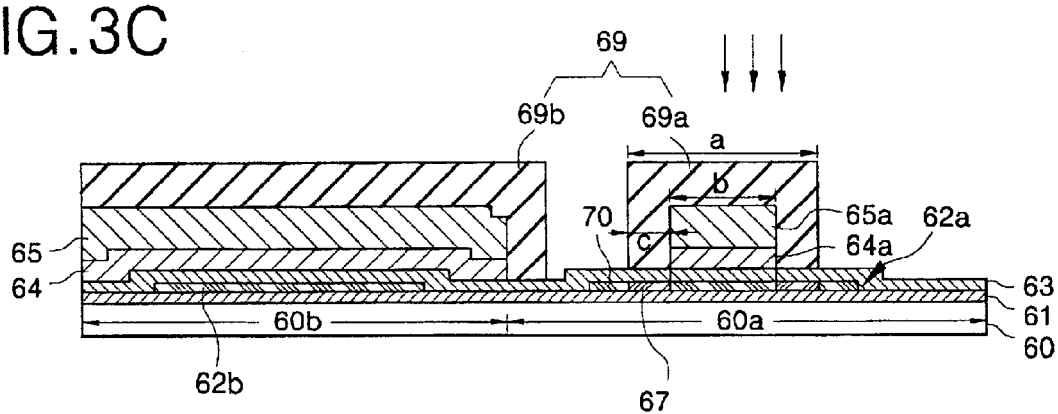

Then, as shown in FIG. 3C, a photoresist pattern 69 is formed as a third mask. A pattern 69a of the third mask 69 formed over the n-type TFT region 69a is to define an LDD region of the n-type TFT. The pattern 69a has a greater width than the gate electrode 64a to sufficiently cover the gate electrode 64a. A pattern 69b of the third mask 69 formed over the p-type TFT region 60b is to protect the p-type TFT region 60b.

Note that the pattern 69a has a width of "a", the gate electrode has a width of "b", and an off-set region that will be formed in a subsequent process has a width of "c". The following equation applies to the above processes: c=a−b. Therefore, a width of the LDD region depends on a width of the third mask 69.

Subsequently, using the third mask, an n-type high-density impurity is ion-implanted into the semiconductor layer 62a on the n-type TFT region 60a to form source and drain regions 70. Therefore, the n-type TFT having the LDD structure is completed.

As described above, since the width "c" of the offset region is a value equal to the width "a" of the third mask 69 minus the width B of the gate electrode 64a, it is possible to easily obtain a desired width of more than 1.0 µm in the LDD region 67 by varying the width of the third mask 69.

Figure 3D:
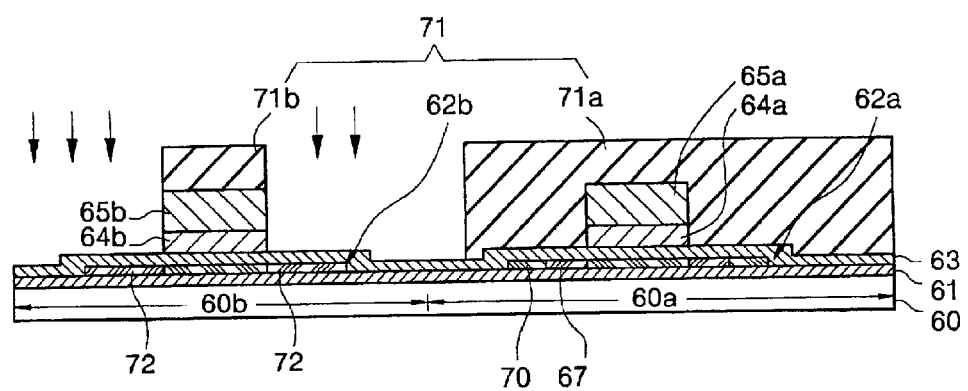

As shown in FIG. 3D, after the third mask 69 is removed, a fourth mask 71 is formed. A pattern 71a of the fourth mask 71 formed over the n-type TFT region 60a is to protect the n-type TFT region 60a from a p-type impurity. A pattern 71b of the fourth mask 71 formed over the p-type TFT region 60b is to form a gate electrode of the p-type TFT.

Using the fourth mask 71, the first metal layer 64 and the second insulating layer 65 are patterned to form a gate electrode 64b and a capping layer 65b of the p-type TFT.

Thereafter, a p-type high-density impurity is ion-implanted into the semiconductor layer 62b of the p-type TFT region 60b to form source and drain regions 72 of the p-type TFT before the fourth mask is removed. Therefore, the p-type TFT is completed.

Figure 3E:
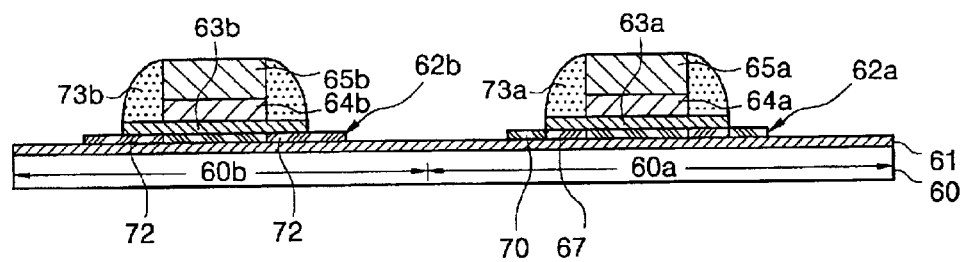

Subsequently, as shown FIG. 3E, a third insulating layer is formed over the whole surface of the substrate 60. As the third insulating layer, an oxidation layer or a nitride layer is used.

The third insulating layer is anisotropically etched to form a spacer 73a on both side walls of the gate electrode 64a and the clapping layer 65a and a spacer 73b on both side walls of the gate electrode 64b and the capping layer 65b, respectively.

At the same time, the first insulating layer 63 is etched to form a gate insulating layers 63a and 63b. The gate insulating layers 63a and 63b are, respectively, formed under the gate electrodes 64a and 64b and the spacer 73a and 73b, so that the high-density source and drain regions 70 and 72 are exposed.

Therefore, since the high-density source and drain regions 70 and 72 are exposed and the gate electrodes 64a and 64b are insulated, a process of forming an interlayer insulator insulating the source and drain electrodes from the gate electrode and contact holes is not required.

Figure 3F:
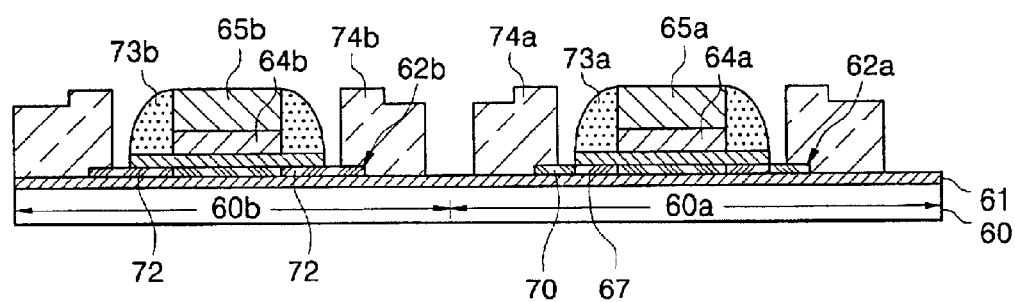

As shown in FIG. 3F, a second metal layer is deposited over the whole surface of the substrate 60 and then patterned using a fifth mask (not shown) to form source and drain electrodes 74a and 74b, respectively.

Therefore, the CMOS TFT according to this embodiment of the present invention is completed.

According to this embodiment of the present invention, since the source and drain electrodes 74a and 74b directly contact the source and drain regions 70 and 72, respectively, a process of forming contact holes can be omitted.

Also, since the gate electrodes 64a and 64b are entirely covered with the capping layers 65a and 65b and the spacers 73a and 73b, even though the source and drain electrodes 74a and 74b directly contact the source and drain regions 70 and 72 without the interlayer insulator, a short circuit between the gate electrode and the source and drain electrodes does not occur.

In the process of manufacturing the CMOS TFT having an LDD structure according to this embodiment of the present invention, if the ion-implanting process to form the low-density source and drain regions 47 of FIG. 3C is omitted and an off-set region is formed instead of the low-density source and drain regions 67, the CMOS TFT having an off-set structure can be manufactured.

As described herein before, the method of manufacturing the CMOS TFT according to embodiments of the present invention has the following advantage in that since the CMOS TFT can be manufactured by four or five mask processes, a manufacturing process is simplified, leading to high manufacturing yield and low production cost.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A method of manufacturing a CMOS TFT, comprising:

forming first and second semiconductor layers on an insulating substrate using a first mask, the substrate having first and second regions, the first semiconductor layer formed on the first region, the second semiconductor layer formed on the second region;

forming sequentially a first insulating layer, a first metal layer and a second insulating layer over the whole surface of the substrate;

etching a portion of the first metal layer and a portion of the second insulating layer over the first region of the substrate using a second mask to form a first gate electrode and a first capping layer;

forming first spacers on both side wall portions of the first gate electrode and the first capping layer;

ion-implanting a first conductive-type high-density impurity into the first semiconductor layer using the first spacers and the first gate electrode as a mask to form first high-density source and drain regions;

etching a portion of the first metal layer and a portion of the second insulating layer over the second region of the substrate using a third mask to form a second gate electrode and a second capping layer; and ion-implanting a second conductive-type high density impurity into the second semiconductor layer using the third mask to form second high-density source and drain regions.

2. The method of claim 1, further comprising performing a channel doping process after forming said first and second semiconductor layers.

3. The method of claim 1, further comprising ion-implanting a first conductive-type low density impurity into the first semiconductor layer to form first low-density source and drain regions using the second mask after etching said portions of the first metal layer and the second insulation layer.

4. The method of claim 1, further comprising forming an off-set region between the first gate electrode and the first source and drain regions from a portion of said first semiconductor layer.

5. The method of claim 3, wherein a first TFT formed on the first region of the substrate is an n-type TFT, and a second TFT formed on the second region of the substrate is a p-type TFT.

6. The method of claim 4, wherein a first TFT formed on the first region of the substrate is an n-type TFT, and a second TFT formed on the second region of the substrate is a p-type TFT.

7. The method of claim 1, wherein the second mask includes a first pattern to form the first gate electrode and a second pattern to protect the second region of the substrate.

8. The method of claim 1, wherein the third mask includes a first mask pattern to protect the first region of the substrate and a second mask pattern to form the second gate electrode.

9. The method of claim 1, further comprising:

forming a third insulating layer over the whole surface of the substrate;

etching the first and third insulating layers to form second spacers on both side wall portions of the second gate electrodes, respectively, while exposing the second high-density source and drain regions; and forming first and second source and drain electrodes using a fourth mask, the first source and drain electrodes contacting the first high-density source and drain regions, the second source and drain electrodes contacting the second high-density source and drain regions.

10. The method of claim 8, wherein the first and second gate electrodes are insulated by the first and second spacers and the first and second capping layers, thereby preventing a short circuit between the first and second gate electrodes and the first and second source and drain electrodes.

11. A method of manufacturing a CMOS TFT, comprising:

forming first and second semiconductor layers on an insulating substrate using a first mask, the substrate having first and second regions, the first semiconductor layer formed on the first region, the second semiconductor layer formed on the second region;

forming sequentially a first insulating layer, a first metal layer and a second insulating layer over the whole surface of the substrate;

etching a portion of the first metal layer and a portion of the second insulating layer over the first region of the substrate using a second mask to form a first gate electrode and a first capping layer;

ion-implanting a first conductive-type high density impurity into the first semiconductor layer to form first high-density source and drain regions using a third mask;

etching a portion of the first metal layer and a portion of the second insulating layer over the second region of the substrate using a fourth mask to form a second gate electrode and a second capping layer; and ion-implanting a second conductive-type high density impurity into the second semiconductor layer using the fourth mask to form second high-density source and drain regions.

12. The method of claim 11, further comprising performing a channel doping process to control a threshold voltage after forming first and second semiconductor layers.

13. The method of claim 11, further comprising ion-implanting a first conductive-type low density impurity into the first semiconductor layer to form first low-density source and drain regions using the second mask after etching said portion of the first metal layer and said portion of the second insulation layer.

14. The method of claim 13, wherein a width of the first low-density source and drain regions of the first TFT depends on a width of the third mask.

15. The method of claim 11, wherein the first source and drain regions are spaced apart from the first gate electrode so that an off-set region is formed between the gate electrode and the first source and drain regions.

16. The method of claim 15, wherein a width of the off-set region depends on a width of the third mask.

17. The method of claim 13, wherein the first region is an n-type TFT, and the second region is a p-type TFT.

18. The method of claim 11, wherein the second mask includes a first pattern to form the first gate electrode and a second pattern to protect the second region of the substrate.

19. The method of claim 11, wherein the fourth mask includes a first mask pattern to protect the first region of the substrate and a second mask pattern to form the second gate electrode.

20. The method of claim 11, further comprising, forming a third insulating layer over the whole surface of the substrate;

etching the first and third insulating layers to form first and second spacers on both side wall portions of the first and second gate electrodes, respectively, while exposing the first and second high-density source and drain regions; and forming first and second source and drain electrodes using a fifth mask, the first source and drain electrodes contacting the first high-density source and drain regions, the second source and drain electrodes contacting the second high-density source and drain regions.

21. The method of claim 20, wherein the first and second gate electrodes are insulated by the first and second spacers and the first and second capping layers, thereby preventing a short circuit between the first and second gate electrodes and the first and second source and drain electrodes.

22. The method of claim 10, wherein said first and second spacers and said capping layers are of an oxidation layer or a nitride layer.

23. The method of claim 21, wherein said first and second spacers and said capping layers are of an oxidation layer or a nitride layer.

24. A method of manufacturing a CMOS TFT, comprising:

forming first and second semiconductor layers on an insulating substrate using a first mask, the substrate having first and second regions, the first semiconductor layer formed on the first region, the second semiconductor layer formed on the second region;

forming sequentially a first insulating layer, a first metal layer and a second insulating layer over the whole surface of the substrate;

etching a portion of the first metal layer and a portion of the second insulating layer over the first region of the substrate using a second mask to form a first gate electrode and a first capping layer;

ion-implanting a first conductive-type low density impurity into the first semiconductor layer to form low-density source and drain regions using the second mask;

forming first spacers on both side wall portions of the first gate electrode and the first capping layer;

ion-implanting a first conductive-type high-density impurity into the first semiconductor layer using the first spacers and the first gate electrode as a mask to form first high-density source and drain regions;

etching a portion of the first metal layer and a portion of the second insulating layer over the second region of the substrate using a third mask to form a second gate electrode and a second capping layer; and ion-implanting a second conductive-type high density impurity into the second semiconductor layer using the third mask to form high-density source and drain regions.

25. A method of manufacturing a CMOS TFT, comprising:

forming first and second semiconductor layers on an insulating substrate using a first mask, the substrate having first and second regions, the first semiconductor layer formed on the first region, the second semiconductor layer formed on the second region;

forming sequentially a first insulating layer, a first metal layer and a second insulating layer over the whole surface of the substrate;

etching a portion of the first metal layer and a portion of the second insulating layer over the first region of the substrate using a second mask to form a first gate electrode and a first capping layer;

ion-implanting a first conductive-type low density impurity into the first semiconductor layer to form low-density source and drain regions using the second mask;

ion-implanting a first conductive-type high density impurity into the first semiconductor layer to form first high-density source and drain regions using a third mask;

etching a portion of the first metal layer and a portion of the second insulating layer over the second region of the substrate using a fourth mask to form a second gate electrode and a second capping layer; and ion-implanting a second conductive-type high density impurity into the second semiconductor layer using the fourth mask to form second high-density source and drain regions.

* * * * *